(12) United States Patent
Vanin et al.

(10) Patent No.: US 10,666,142 B2
(45) Date of Patent: May 26, 2020

(54) SWITCHING CONVERTER USING PULSE-WIDTH MODULATION AND CURRENT-MODE CONTROL

(71) Applicant: Infineon Technologies AG, Neubiberg (DE)

(72) Inventors: Marco Vanin, Mestre-Venezia (IT); Cristian Garbossa, Bressanone (IT); Stefano Orlandi, San Bonifacio (IT); Winand Van Sloten, Padua (IT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/192,672

(22) Filed: Nov. 15, 2018

(65) Prior Publication Data

US 2019/0157975 A1    May 23, 2019

(30) Foreign Application Priority Data

Nov. 20, 2017 (DE) .......................... 10 2017 127 263

(51) Int. Cl.
*H02M 3/158* (2006.01)
*H03K 7/08* (2006.01)
*H02M 1/00* (2006.01)

(52) U.S. Cl.
CPC .............. *H02M 3/158* (2013.01); *H03K 7/08* (2013.01); *H02M 2001/0009* (2013.01); *H02M 2001/0022* (2013.01)

(58) Field of Classification Search
CPC ............... H02M 3/158; H02M 1/0009; H02M 2001/0022; H02M 1/08; H02M 1/14;

(Continued)

(56) References Cited

U.S. PATENT DOCUMENTS 7,362,083 B2 * 4/2008 Scoones ................ H02M 3/158
                                                    323/284
7,446,621 B2 * 11/2008 Chen ....................... H03K 7/10
                                                    332/108

(Continued)

FOREIGN PATENT DOCUMENTS

WO     2017084868 A1    5/2017

OTHER PUBLICATIONS

Office Action, in the German language, from counterpart German Application No. 102017127263.1, dated Sep. 24, 2018, 6 pp.

*Primary Examiner* — Gustavo A Rosario-Benitez
(74) *Attorney, Agent, or Firm* — Shumaker & Sieffert, P.A.

(57) ABSTRACT

In accordance with one embodiment, a switching converter includes a switching circuit configured to receive a switching signal and to alternatingly connect an output node of the switching circuit with a supply node and a reference node in accordance with the switching signal. An input voltage is operably applied between the supply node and the reference node. The switching converter further includes an inductor coupled between the output node of the switching circuit and an output node of the switching converter as well as an oscillator configured to generate a clock signal with an oscillator frequency depending on the input voltage. A switching controller is configured to receive the clock signal and to generate the switching signal using pulse-width modulation (PWM), wherein the frequency of the switching signal is set in accordance with the oscillator frequency and a duty cycle of the switching signal is deter-mined using current-mode control.

16 Claims, 5 Drawing Sheets

(58) Field of Classification Search
CPC .................. H02M 3/04; H02M 3/156; H02M 2003/1566; H02M 3/1588; H02M 2001/0003
See application file for complete search history.

(56) References Cited

U.S. PATENT DOCUMENTS

| | | | |
|---|---|---|---|
| 2006/0061342 A1* | 3/2006 | Bernacchia ......... | H02M 3/1588 323/282 |
| 2012/0153919 A1* | 6/2012 | Garbossa ............. | H02M 3/156 323/284 |
| 2012/0223693 A1 | 9/2012 | Tang et al. | |
| 2013/0329462 A1* | 12/2013 | Duvnjak ........... | H02M 3/33523 363/15 |
| 2014/0152273 A1* | 6/2014 | Angelin ................ | H02M 3/156 323/266 |
| 2014/0210441 A1 | 7/2014 | Mao et al. | |
| 2015/0061611 A1* | 3/2015 | Li ....................... | H02M 3/1588 323/235 |
| 2015/0214827 A1* | 7/2015 | Yoon ................... | H02M 3/1588 323/286 |
| 2016/0329734 A1* | 11/2016 | Lee ...................... | H02M 3/156 |
| 2018/0048232 A1* | 2/2018 | Adell .................. | H02M 3/1563 |
| 2018/0131275 A1* | 5/2018 | Guan ................... | H02M 3/156 |

* cited by examiner

SWITCHING CONVERTER USING PULSE-WIDTH MODULATION AND CURRENT-MODE CONTROL

This Application claims priority to German Application Number 102017127263.1, filed on Nov. 20, 2017, the entire content of which is incorporated herein by reference.

TECHNICAL FIELD

The present disclosure relates to the field of switching converters such as DC/DC buck converters or the like.

BACKGROUND

Switching converters are usually operated in different operating modes dependent on one or more parameters like the input voltage, the output voltage and the output current (i.e. the load). The different operating modes differ in the switching control of the electronic switches that control the current flow through an inductor (choke) of the switching converter. Switching converters can be operated in continuous conduction mode (CCM) and discontinuous conduction mode (DCM). In CCM the inductor current continuously passes through the inductor without dropping to zero, whereas in DCM, the inductor current has a discontinuous waveform as the current drops to zero in each switching cycle.

The switching operation of electronic switches is determined by a switching signal that triggers activation/deactivation of the electronic switches. The switching signal is a logic signal (i.e. assumes only logic high level or a logic low level) than can be modulated using different modulation schemes in order to regulate, e.g., the output voltage or the output current. Common modulation schemes are pulse width modulation (PWM) and pulse frequency modulation (PFM). When using PWM, the duty cycle of the switching signal is adjusted by adjusting the on-time (i.e. the pulse width) of the switching signal in each switching cycle, while the switching frequency is constant. When using PFM, the switching frequency is adjusted by adjusting the temporal position of the pulses of the switching signal, while the pulse-width (i.e. the on-time in a switching cycle) is constant.

Both modes, CCM and DCM, can be combined with one of the modulation schemes PWM and PFM. Thus, four operating modes can be distinguished, i.e. PFM-DCM, PWM-DCM, PWM-CCM, and PFM-CCM. The achievable efficiency of the power conversion can be different for different operating modes for a specific operating point (e.g., for a specific combination of input voltage, output voltage, output current). Further, some operation modes may not be suitable for a specific range of operating modes. In order to optimize efficiency, multimode switching converters have been developed, which are configured to operate in two or more different operating modes. The operating point of the switching converter is monitored and, if a mode switch condition is reached, the operating mode is changed.

In some operating modes, stability problems may occur, whereas a stable operation may generally easy be guaranteed when using PWM-CCM. However, CCM may not be trivial to be stabilized in a specific range of operating points such as operating points with high input voltage and high output current (high load).

SUMMARY

A switching converter is described herein. In accordance with one embodiment, the switching converter includes a switching circuit configured to receive a switching signal and to alternatingly connect an output node of the switching circuit with a supply node and a reference node in accordance with the switching signal ($S_{PWM}$). An input voltage is operably applied between the supply node and the reference node. The switching converter further includes an inductor coupled between the output node of the switching circuit and an output node of the switching converter as well as an oscillator configured to generate a clock signal with an oscillator frequency depending on the input voltage. A switching controller is configured to receive the clock signal and to generate the switching signal using pulse-width modulation (PWM), wherein the frequency of the switching signal is set in accordance with the oscillator frequency and a duty cycle of the switching signal is determined using current-mode control.

Further, a method is described herein. In accordance with one embodiment, the method includes alternatingly applying an input voltage and a reference potential to a first terminal of an inductor of a switching converter in accordance with a switching signal using a switching circuit, which is included in the switching converter. The method further includes generating a clock signal with an oscillator frequency depending on the input voltage and generating the switching signal using pulse-width modulation (PWM), wherein the frequency of the switching signal is set in accordance with the oscillator frequency and a duty cycle of the switching signal is determined using current-mode control.

BRIEF DESCRIPTION OF THE DRAWINGS

The invention can be better understood with reference to the following drawings and descriptions. The components in the figures are not necessarily to scale; instead emphasis is placed upon illustrating the principles of the invention. In the figures, like reference numerals designate corresponding parts. In the drawings.

DETAILED DESCRIPTION

Figure 1:
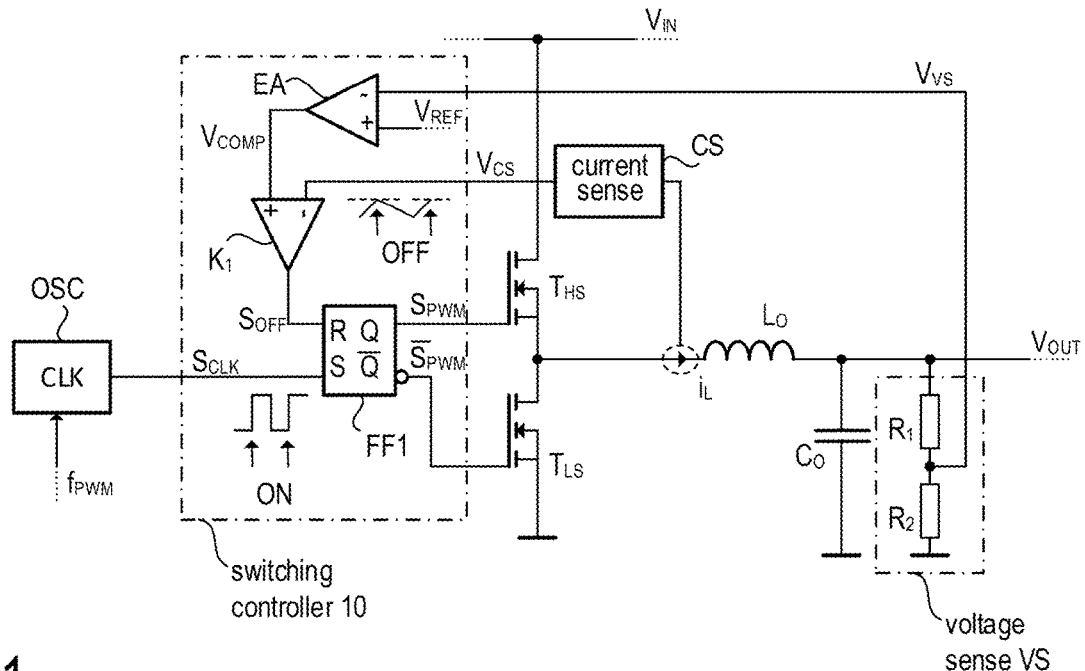
FIG. 1 is a circuit diagram illustrating one example of a buck-converter with current-mode controlled PWM.

FIG. 1 is a circuit diagram illustrating one example of a buck-converter with a switching controller that is able operate (amongst other operating modes) in PWM-CCM. In the current example, only those portions of the circuit are shown, which are used for PWM control, to keep the illustration simple. Furthermore, it is understood that although a buck converter is used in the embodiments described herein, the concepts used are not limited to buck converter and may readily applied to other types of switching converters such as flyback converters, boost converters or the like.

In the present example, the buck converter includes a switching circuit, which is connected between an input circuit node and a reference node. An input voltage $V_{IN}$ is applied between the supply node and the reference node, which is usually at a reference potential (e.g. ground potential). In the present example, the switching circuit is implemented as a transistor half bridge that is composed of a high-side transistor $T_{HS}$ and a low-side transistor $T_{LS}$. The two transistors $T_{LS}$ and $T_{HS}$ are connected in series at an output circuit node of the switching circuit. In the present examples, the two transistors $T_{LS}$ and $T_{HS}$ are implemented as MOS transistors (MOSFETs). However, any other type of transistor may be employed instead. In some examples, a diode may be used instead of the low-side transistor $T_{LS}$.

The switching converter further includes an inductor $L_O$, which is connected between the output circuit node of the switching circuit (e.g. the transistor half-bridge) and an output circuit node (shortly referred to as output) of the switching converter, at which the output voltage $V_{OUT}$ is applied. According to the present example, an output capacitor $C_O$ may be connected between the output of the switching converter and a reference circuit node (e.g. ground node) in order to buffer the output voltage $V_{OUT}$. Generally, the switching circuit is configured to alternatingly apply the input voltage $V_{IN}$ and a reference voltage (e.g. 0 volts, ground potential) to the inductor $L_O$.

The switching operation of the switching circuit may be determined by one or more switching signals, which are generated by the switching controller 10. In the present example of FIG. 1 the switching signal, which is supplied to the high-side transistors, is denoted as $S_{PWM}$, whereas the switching signal, which is supplied to the low-side transistor, is denoted as $\overline{S}_{PWM}$. It is noted that the signal $\overline{S}_{PWM}$ is basically an inverse version of the signal $S_{PWM}$ (except for a small dead time). In other implementations, a single switching signal $S_{PWM}$ may be sufficient, for example, because the switching circuit includes only one active electronic switch or circuitry for distributing the switching signal $S_{PWM}$ to two or more electronic switches.

PWM is as such known in the field of switching converters and thus the generation of the switching signal is only shortly summarized here. Generally, the switching signal $S_{PWM}$ has a constant frequency denoted as $f_{PWM}$, while the on-time $T_{ON}$ of the switching signal $S_{PWM}$ is adjusted in each switching cycle. The ratio between the on-time $T_{ON}$ and the switching period $T_{PWM} = f_{PWM}^{-1}$ is usually referred to as duty cycle. In other words, the duty cycle of the switching signal is updated in each switching cycle in order to regulate the output voltage or the output current, while the switching period is substantially constant. The switching frequency $f_{PWM}$ is determined by a clock signal $S_{CLK}$ that may be generated by an oscillator OSC. Oscillator OSC may be implemented using any known oscillator circuit such as a relaxation oscillator circuit or the like.

In the present example, the switching controller 10 implements a so-called current-mode control (e.g. peak current-mode control in the present example), which includes two feedback loops, i.e. current feedback as well as a voltage feedback. Basically, a first (inner) control loop regulates the peak value of the inductor current $i_L$. The current set-point (see FIG. 1, $V_{COMP}$) for the current control is determined by a second (outer) control loop and set such that the output voltage $V_{OUT}$ is stabilized at a desired voltage set-point.

In the example of FIG. 1, the switching controller 10 includes an RS flip-flop FF1, which receives the clock signal $S_{CLK}$ at a set input S. Accordingly, the switching signal $S_{PWM}$ provided at output Q of the RS flip-flop FF1 is set to a high signal level regularly and synchronously to the clock signal $S_{CLK}$. The RS flip-flop FF1 receives a reset signal $S_{OFF}$ at a reset input R, wherein the reset signal $S_{OFF}$ indicates (by a applying high level at the reset input R) the time instant, at which the inductor current $i_L$ reaches a current set-point. The inductor current $i_L$ is represented by current sense signal $V_{CS}$ and the current set-point by the threshold $V_{COMP}$. The switching controller 10 includes a comparator $K_1$ that is configured to compare the current sense signal $V_{CS}$ with the threshold $V_{COMP}$. Each time the current sense signal $V_{CS}$ reaches the threshold $V_{COMP}$, the comparator $K_1$ signals to the RS flip-flop FF1 to reset the switching signal $S_{PWM}$ to a low signal level. The inverse switching signal $\overline{S}_{PWM}$ is provided at output $\overline{Q}$.

In the present example, the current sense signal $V_{CS}$ is provided by a current sense circuit CS that is configured to sense the inductor current $i_L$ and generate a corresponding current sense signal $V_{CS}$. In a simple example, the current sense circuit CS may be a simple current sense resistor connected in series to the inductor $L_O$. However, more sophisticated circuits are known for the purpose of current measurement such as sense transistors coupled to the transistors in the switching circuit or the like.

The threshold $V_{COMP}$ (i.e. the current set-point for the inner control loop) is provided at an output of error amplifier EA, which is configured to amplify the control error $V_{VS} - V_{REF}$, wherein $V_{VS}$ is a voltage sense signal representing the output voltage $V_{OUT}$ and $V_{REF}$ is a reference voltage representing the voltage set-point for the outer control loop. Optionally, an integrator and/or a loop filter may be coupled between the error amplifier EA and the comparator $K_1$.

In the present example, the voltage sense signal $V_{VS}$ is provided by a voltage sense circuit VS coupled between the output of the switching converter and an input of the error amplifier EA. In the present example, the voltage sense circuit VS is composed of resistors $R_1$ and $R_2$ forming a simple resistive voltage divider. However, more complex voltage sense circuits may be used instead.

To summarize the above, in PWM-CCM the switching controller 10 makes use of two feedback loops, wherein the first feedback loop is formed by the current sense circuit CS and comparator $K_1$ and the second feedback loop is formed by the voltage sense circuit VS and the error amplifier EA. The first feedback loop is part of a control loop used for controlling the inductor current $i_L$, whereas the second feedback loop is part of a control loop used for controlling the output voltage $V_{OUT}$.

It is understood that the concept of (peak) current-mode control during PWM operation of a switching converter as depicted in FIG. 1 may be implemented in several ways. In some implementations, the error amplifier EA is a transconductance amplifier having a current output; similarly, the current sense circuit CS has also a current output. That is, the error signal $V_{COMP}$ as well as the current sense signal $V_{CS}$ are currents in such implementations. The error signal and the current sense signal (both currents) may then be subtracted (by superposition) at a circuit node and the difference current be directed to a resistor. The voltage drop across the transistor is then supplied to a comparator circuit (corresponds to K1 in FIG. 1), which uses a fixed comparator threshold. Further currents can be superposed at the mentioned circuit node, e.g. for slope compensation to avoid subharmonic oscillations. However, this and various other implementations basically provide the same basic functions as the general example of FIG. 1. Many of these implementations are as such known and are thus not further discussed here.

Figure 2:
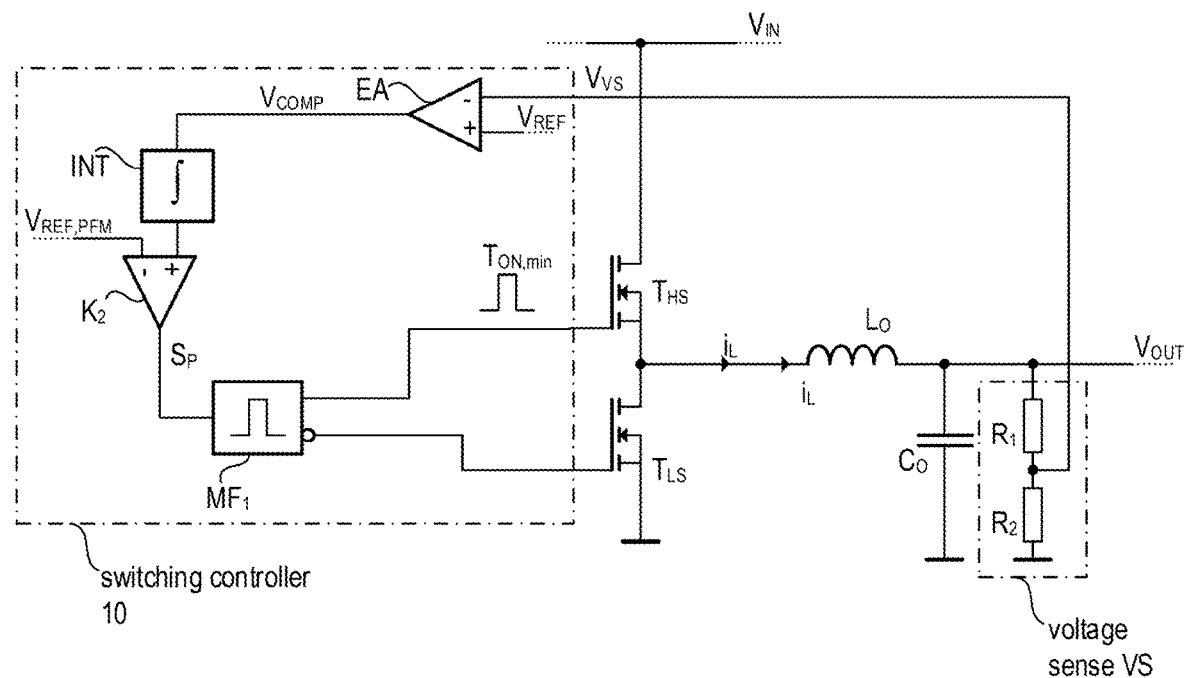
FIG. 2 is a circuit diagram illustrating one example of a buck-converter operating in PFM.

As mentioned above, PWM-CCM may not be suitable in some situations. For example, when the switching converter is loaded by only a very light load (output current low) or when the input voltage $V_{IN}$ is high, a mode switch to PFM-DCM or PFM-CCM may be necessary in order to be able to maintain the output voltage regulation. Before discussing the mode switch conditions in more detail, one example of a switching controller operating in PFM-CCM mode is illustrated in FIG. 2. In this example, only those portions of the switching controller 10 are shown, which are used for PFM control, to keep the illustration simple. It is understood, that the circuit components used for PWM control and PFM control as well as further circuitry for triggering mode switches can be included in the switching controller 10.

According to the FIG. 2 the switching circuit (transistor half-bridge), the inductor $L_O$, the output capacitor $C_O$, the voltage sense circuit VS, and the error amplifier EA are the same as in the example of FIG. 1. However, the configuration of the switching controller is different from the previous example. Accordingly, the output signal $V_{COMP}$ of the error amplifier EA (error signal) is integrated by (inverting) integrator INT, and the integrated error signal is compared to a threshold (which may be 0 volts or any other constant threshold $V_{REF,PPM}$ as depicted in FIG. 2) by comparator $K_2$. The output of the comparator $K_2$ is coupled to a pulse generator circuit MF1 that is configured to generate a pulse of defined pulse length $T_{ON}$ when triggered by the comparator output signal. Various implementations of the pulse generator circuit are as such known and thus not further explained here. Some pulse generator implementations are known as "one-shot circuit" or monostable multivibrator circuits. However, various other implementations, which provide the same function, are applicable.

A pulse is generated in response to the comparator $K_2$ detecting that the integrated error signal has reached the threshold provided to the comparator $K_2$. As such, the pulse length (on time $T_{ON,min}$) of the pulses in the switching signal is fixed, wherein the switching frequency (pulse repetition frequency) varies in accordance with the measured error signal $V_{COMP}$. As in the previous example of FIG. 1, the switching signal is supplied to the high side transistor $T_{HS}$ and an inverse switching signal to the low-side transistor $T_{LS}$ of the half-bridge.

Figure 3:
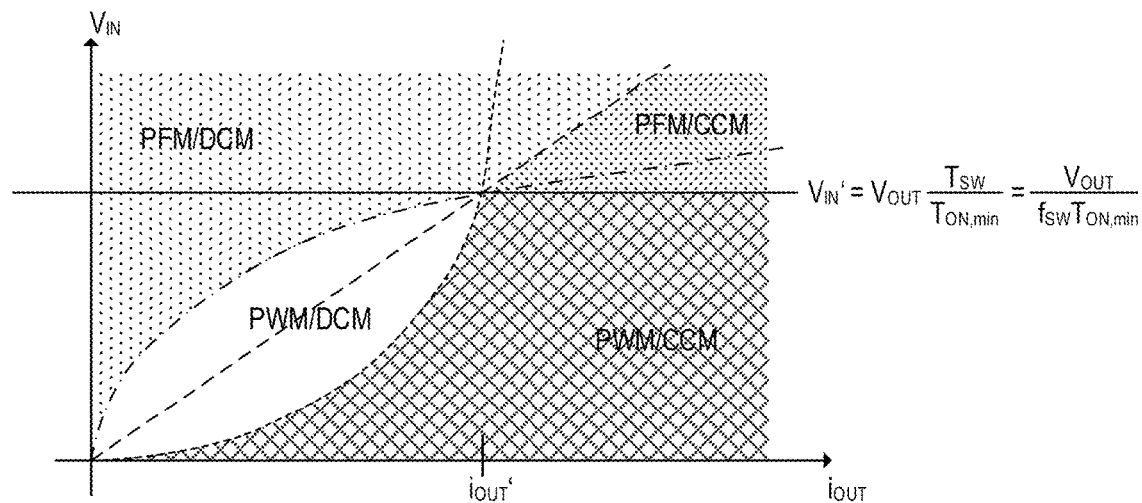
FIG. 3 is a diagram illustrating mode-switch conditions for mode-switches between PFM-DCM, PWM-DCM, PWM-CCM, and PFM-CCM.

FIG. 3 is a diagram illustrating mode-switch conditions for mode-switches between PFM-DCM, PWM-DCM, PWM-CCM, and PFM-CCM. Accordingly, PFM-DCM is used for operating points in the light shaded area above the dash-dotted line and the dashed diagonal. PWM-DCM is used for operating points in the area between the dash-dotted line and the curved dashed line. PWM-CCM is used for operating points in the hatched area under to the right of the curved dashed line and below the horizontal solid line. Finally, PFM-CCM is used for operating points above the horizontal solid line and to the right of the dashed diagonal.

The following discussion concentrates on the mode switch between PWM-CCM and PFM-CCM, which is relevant in situations with a comparably high output current lour (high load) greater than $i_{OUT}$'. In the example of FIG. 3, the mode switch condition (horizontal solid line) for a mode switch from PWM-CCM to PFM-CCM is given by the equation $$V_{IN} > V_{OUT} \frac{T_{SW}}{T_{ON,min}} = \frac{V_{OUT}}{f_{SW} \cdot T_{ON,min}}, \tag{1}$$

wherein $f_{SW}=T_{SW}^{-1}$ is the PWM switching frequency $f_{PWM}$ provided by the oscillator OSC in operating modes using PWM. The minimum on-time $T_{ON,min}$ is the minimum on-time that can be generated in PWM operation ($T_{ON,min} \cdot f_{PWM}$ being the minimum duty cycle) and also equals the fixed on-time during PFM operation.

In other words, a mode switch from PWM-CCM to PFM-CCM is triggered when the output voltage $V_{OUT}$ falls below the value $V_{OUT}$' given by $$V_{OUT}'=V_{IN} \cdot f_{PWM} \cdot T_{ON,min}, \tag{2}$$

wherein the PWM switching frequency $f_{PWM}$ and the minimum on-time $T_{ON,min}$ are known constant system parameters. This is tantamount to the input voltage $V_{IN}$ exceeding the value $V_{IN}$' given by $$V_{IN}' = \frac{V_{OUT}}{f_{PWM} \cdot T_{ON,min}}. \tag{3}$$

Figure 4:
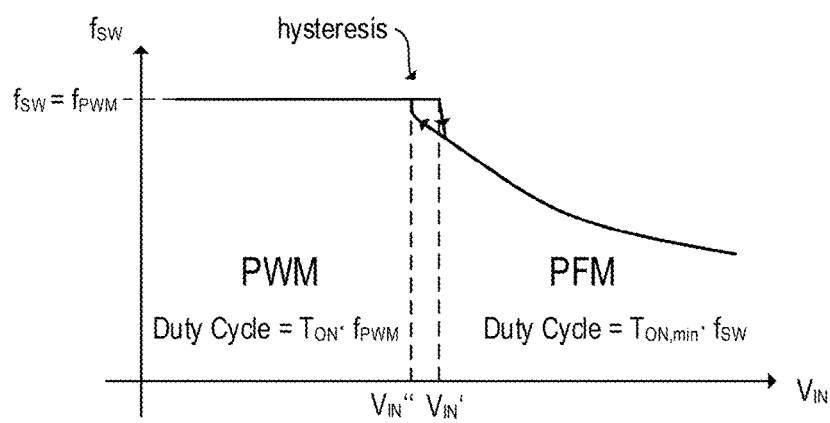
FIG. 4 is a diagram illustrating the switching frequency during a mode switch from PWM-CCM to PFM-CCM and vice versa.

FIG. 4 is a diagram illustrating the relation between the switching frequency $f_{SW}$ and the input voltage $V_{IN}$ during a mode switch from PWM-CCM to PFM-CCM when using a multi-mode switching controller as described with reference to FIGS. 1 and 2. Accordingly, the switching frequency $f_{SW}$ is equal to the PWM frequency $f_{PWM}$ and constant for input voltages $V_{IN}$ lower than $V_{IN}$'. When the input voltage exceeds the critical voltage $V_{IN}$' (see equation (3)), the switching controller switches to PFM-CCM and the switching frequency $f_{SW}$ monotonously decreases with increasing input voltage $V_{IN}$. For the mode switch back to PWM-CCM the critical voltage is somewhat lower at $V_{IN}$", and the mode switch exhibits the hysteresis that can be seen in FIG. 4. The width of the hysteresis may vary dependent on the actual implementation of the circuitry responsible for the modeswitching.

In addition to the hysteresis, which may be undesired in some applications, a modes switch to PFM-CCM may be further undesirable as stability problems may occur in PIM-CCM operation mode, which may lead to undesired RF signal components in the output voltage of the switching converter. The exemplary switching converter implementations discussed below allows covering a greater range of operating points with PWM-CCM mode and thus avoiding the need to switch over to PFM-CCM.

Figure 5:
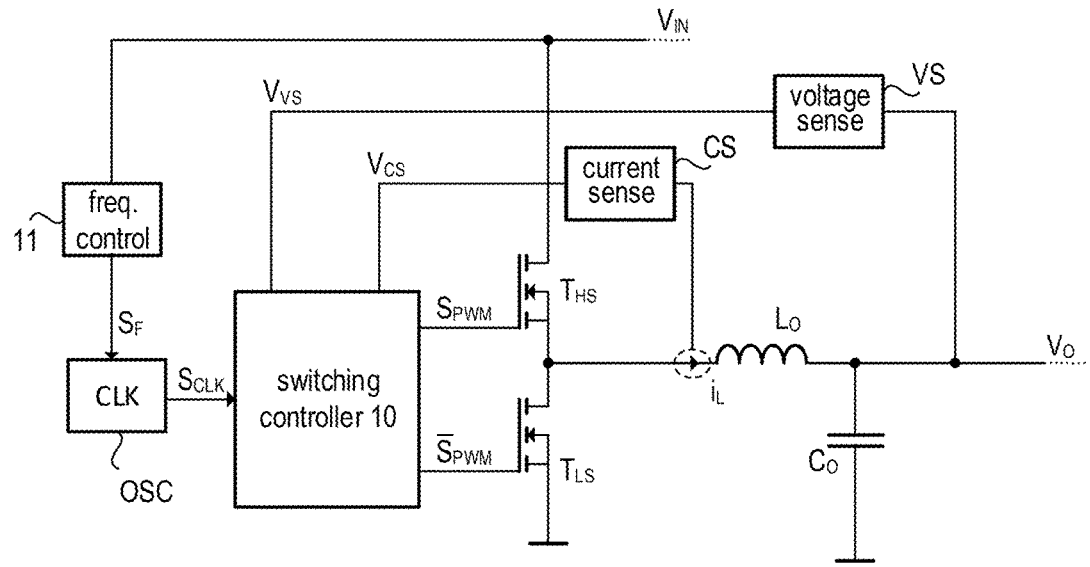
FIG. 5 is a circuit diagram illustrating one exemplary embodiment of a switching converter with a continuous variation of the PWM switching frequency for high input voltages.

FIG. 5 illustrates one embodiment of a switching converter, which is able to operate using a modified pulse width modulation (PWM), wherein the PWM switching frequency $f_{PWM}$ is not constant but may be gradually reduced when the input voltage exceeds a specific threshold $V_{IN}^*$, which is significantly lower than the threshold $V_{IN}'$ mentioned in equation (3).

In the example of FIG. 5, the switching circuit (transistor half bridge), the inductor $L_O$, the output capacitor $C_O$, the voltage sense circuit VS and the current sense circuit CS are substantially the same as in the example of FIG. 1 and reference is made to the respective description above to avoid redundant explanations. In the present example, the switching controller 10 is configured to generate the switching signals $S_{PWM}$ and $\overline{S}_{PWM}$ for the switching circuit (transistor half bridge) using PWM and (e.g. peak) current-mode control.

In the present example, the switching controller 10 receives the voltage sense signal $V_{VS}$ and the current sense signal $V_{CS}$ as feedback signals (in order to monitor the output voltage $V_{OUT}$ and the inductor current $i_L$). As described in detail with reference to FIG. 1 current-mode control includes using a first feedback loop for controlling the inductor current it, and a second control loop for controlling the output voltage $V_{OUT}$. The frequency $f_{SW}$ of the pulse-width modulated switching signal is determined by the frequency $f_{PWM}$ the clock signal $S_{CLK}$ provided by the oscillator OSC ($f_{SW}=f_{PWM}$). However, different from the conventional example of FIG. 1, the frequency $f_{PWM}$ the clock signal $S_{CLK}$ is not set to a constant value but rather gradually reduced (starting from a nominal value) when the input voltage $V_{IN}$ increases beyond the specific threshold $V_{IN}'$. In order to tune the oscillation frequency of the oscillator OSC, the switching converter includes a frequency control circuit 11, which is configured to generate a frequency control signal $S_F$ dependent on the current input voltage $V_{IN}$, wherein the frequency control signal $S_F$ represents a desired oscillation frequency of the oscillator OSC. Thereby, the frequency control circuit 11 may generate the frequency control signal $S_F$ in accordance with any characteristic curve representing a relation between input voltage $V_{IN}$ and switching frequency $f_{PWM}$.

It is noted that the frequency control circuit 11 and the oscillator OSC together form a voltage controlled oscillator whose oscillation frequency can be controlled by the input voltage $V_{IN}$ of the switching converter ($V_{IN}$ controlled oscillator) while operating in PWM-CCM. Reducing the PWM switching frequency $f_{PWM}$ for increasing input voltages $V_{IN}$ while maintaining PWM operation (using current-mode control) allows avoiding a mode-switch to PFM-CCM for high input voltages. It is noted, however, that the embodiments described herein nevertheless allow switching to PFM-DCM (or other operating modes with low quiescent current like PFM-DCM with pulse skipping or burst mode) for low output currents (low load).

Figure 6:
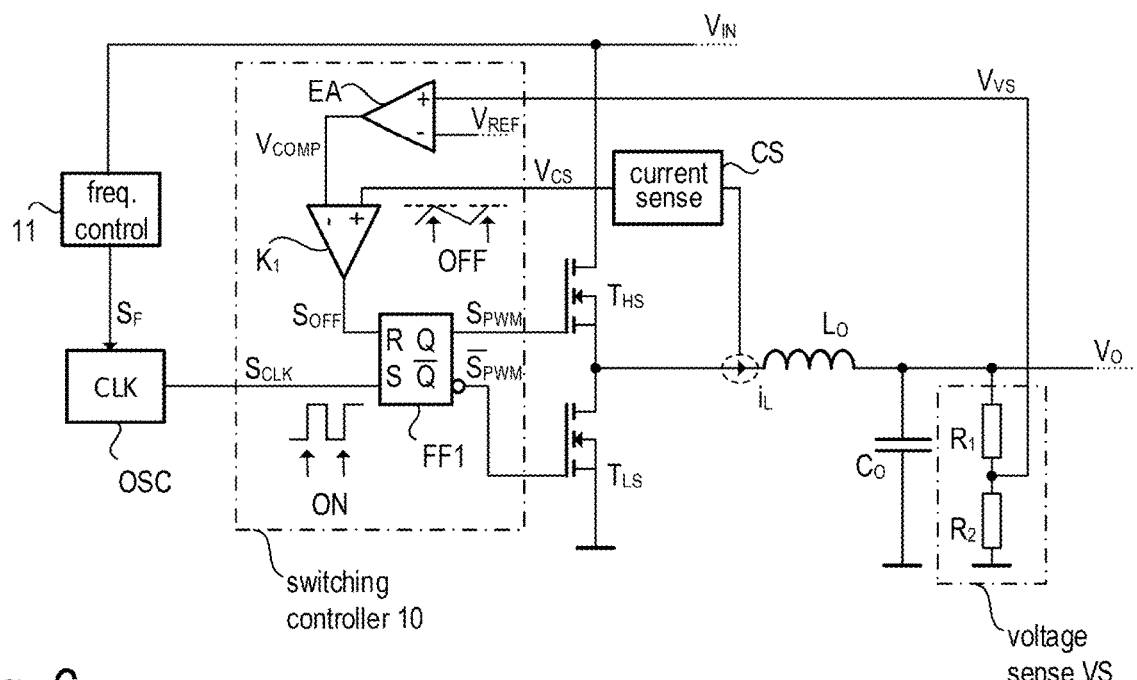
FIG. 6 is a circuit diagram illustrating the embodiment of FIG. 5 with one exemplary implementation of the switching controller shown in more detail.

The example of FIG. 6 is substantially the same as the example of FIG. 5, wherein the switching controller 10 is implemented in the same way as in the example of FIG. 1. Accordingly, one can see the two feedback loops, wherein the first feedback loop (current sense circuit CS and comparator $K_1$) is part of the current control loop and the second feedback loop (voltage sense circuit VS and error amplifier EA) is part of the voltage control loop. The function of the error amplifier EA, the comparator $K_1$, and the RS flip-flop FF1 is the same as in the example of FIG. 1 and reference is made to the respective description above to avoid redundant explanations. However, different from the example of FIG. 1, the frequency $f_{PWM}$ of the clock signal $S_{CLK}$) and thus the frequency of the switching signal $S_{PWM}$) is not constant but can be varied dependent on the current value of the input voltage $V_{IN}$.

It is noted that this "modified" PWM operation with adjustment of the switching frequency $f_{PWM}$ is not to be confused with PFM operation. In PFM the switching frequency (pulse repetition frequency) is adjusted using a feedback of the output voltage (voltage sense signal $V_{VS}$) in a closed control loop to regulate the output voltage $V_{OUT}$. In contrast thereto, in the examples of FIGS. 5 and 6 the PWM switching frequency is directly (feedforward) controlled based on the input voltage $V_{IN}$ only. In addition to the adjustment of the PWM switching frequency, current-mode control is implemented as described in details with reference to FIG. 1.

Figure 7:
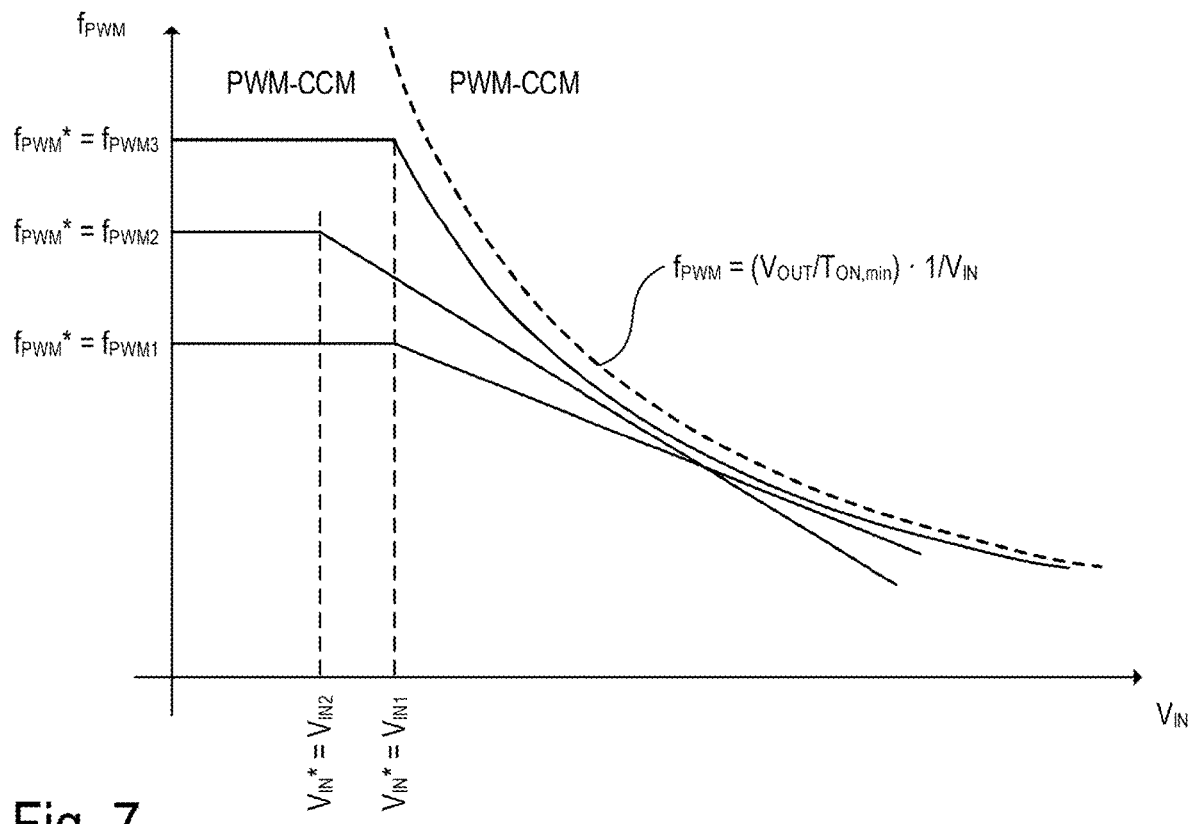
FIG. 7 is diagram illustrating characteristic curves, according to which the PWM switching frequency may be varied dependent on the input voltage, as well as the mode switch condition for switching between PWM-CCM and PFM-CCM.

FIG. 7 is a diagram illustrating characteristic curves according to which the PWM switching frequency $f_{PWM}$ may be varied dependent on the input voltage $V_{IN}$ in accordance with the embodiments of FIGS. 5 and 6. As can be seen from FIG. 7, the characteristic curve is flat (PWM switching frequency $f_{PWM}=f_{PWM}^*$ is constant) for input voltages $V_{IN}$ lower or equal to the input voltage threshold $V_{IN}^*$ ($V_{IN} \leq V_{IN}^*$) and monotonously decreases for input voltages $V_{IN}$ above the input voltage threshold $V_{IN}^*$ ($f_{PWM}<f_{PWM}^*$ for $V_{IN}>V_{IN}^*$). The threshold $V_{IN}^*$ and the PWM switching frequency $f_{PWM}^*$ are constant system parameters that may be (directly or indirectly) fixed at the time the switching converter is designed for a specific application. In applications, in which the PWM switching frequency $f_{PWM}^*$ or the output voltage $V_{OUT}$ can be programmed or otherwise set by a user of the circuit, the threshold $V_{IN}^*$ may be set dependent on $V_{OUT}$ or $f_{PWM}^*$ in order to obtain a suitable characteristic curve similar to those shown in FIG. 7. The boundary between PWM-CCM and PFM-CCM is also shown in FIG. 7 as dashed line. The boundary line has a $1/x$-characteristic in accordance with equation (3) the boundary line is given by the function $f_{PWM}=(V_{OUT}/T_{ON,min})\ 1/V_{IN}$. As the input voltage $V_{IN}$ is plotted along the x-axis, the boundary line is proportional to $1/V_{IN}$.

In FIG. 7 three different characteristic curves are depicted as examples. It is understood that the depicted curves have to be regarded as examples and various other curves may be applicable in different applications. The first characteristic curve exhibits a constant PWM switching frequency $f_{PWM}^*=f_{PWM1}$ for input voltages $V_{IN}$ below the threshold $V_{IN}^*=V_{IN1}$, and a linear decrease for higher input voltages (above $V_{IN1}$). The second characteristic curve exhibits a constant PWM switching frequency $f_{PWM}^*=f_{PWM2}$ for input voltages $V_{IN}$ below the threshold $V_{IN}^*=V_{IN2}$, and a linear decrease for higher input voltages (above $V_{IN2}$). Finally, the third characteristic curve exhibits a constant PWM switching frequency $f_{PWM}^*=f_{PWM3}$ for input voltages $V_{IN}$ below the threshold $V_{IN}^*=V_{IN1}$, and a $1/x$-shaped decrease for higher input voltages (above $V_{IN2}$). When using the $1/x$ characteristic, the PWM switching frequency can be kept at a constant value $f_{PWM}^*$ until shortly before crossing the boundary line and the $1/x$-shaped decrease of the characteristic curve matches the shape of the boundary line, so that an undesired mode-switch to PFM-CCM is avoided and PWM operation is maintained. Furthermore, the above-mentioned hysteresis as shown in FIG. 4 is avoided as no mode switch occurs at the input voltage $V_{IN}^*$.

Figure 8:
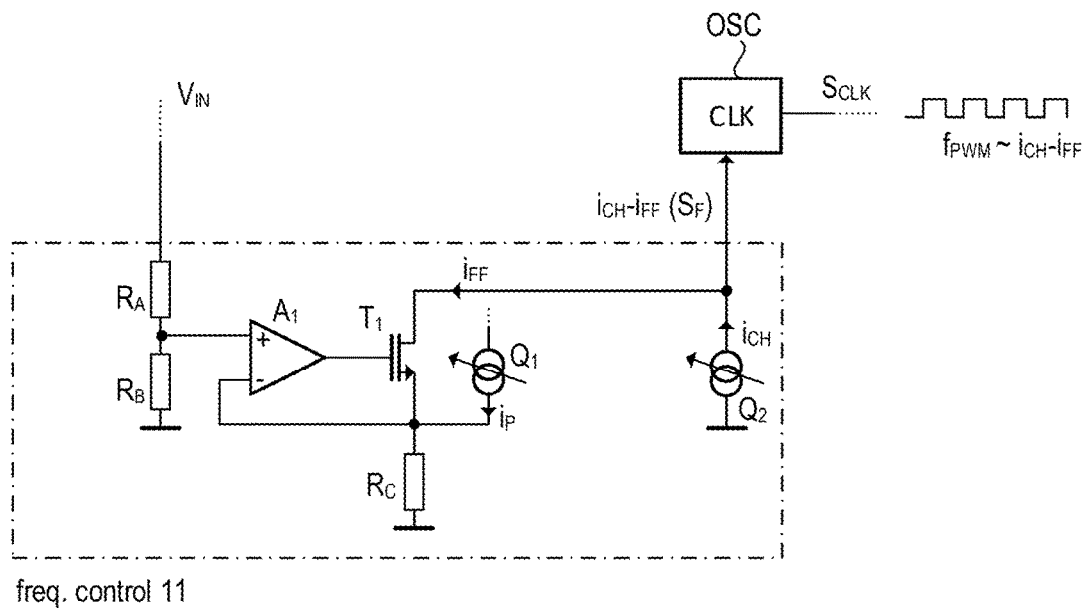
FIG. 8 illustrates one exemplary implementation of the PWM frequency control which may be used in the embodiments described herein.

FIG. 8 illustrates one exemplary implementation of the PWM frequency control circuit 11 which may be using in the embodiments shown in FIGS. 5 and 6. The circuit of FIG. 8 basically implements a controllable current source that is configured to be controlled based on the input voltage according to a defined characteristic curve, such as the first curve of FIG. 7. Accordingly, the circuit of FIG. 8 includes a transistor $T_1$ that may be regarded as voltage-controlled current source (transistor current $i_{FF}$) and a current source $Q_1$ draining a current $i_P$, wherein the current $i_P$ may be fixed at the time the switching converter is designed for a specific application. As will be shown further below, $i_P$ influences the threshold $V_{IN}$ (see FIG. 7). The transistor T and the current source $Q_1$ are connected to a first terminal of resistor $R_C$ such that the sum current $i_{FF}+i_P$ passes through the resistor $R_C$. The second terminal of the resistor $R_C$ may be connected to ground. The circuit of FIG. 8 further includes a voltage divider composed of resistors $R_A$ and $R_B$ and configured to divide the input voltage $V_{IN}$ and provide the fraction $V_{IN} \cdot R_B /(R_A+R_B)$. This voltage divider output voltage as well as the voltage drop $R_C(i_{FF}+i_P)$ across the resistor $R_C$ are supplied to a differential amplifier $A_1$ (operational amplifier), whose output controls the transistor current $i_{FF}$ passing through the transistor $T_1$.

If the gain of the operational amplifier $A_1$ is sufficiently high, the transistor current will can be calculated as follows:

$$i_{FF} = \begin{cases} 0 & \text{if } V_{IN} \leq V_{IN}^* \\ \dfrac{V_{IN}}{R_C} \cdot \dfrac{R_B}{R_A+R_B} - i_P & \text{if } V_{IN} > V_{IN}^* \end{cases} \quad (4)$$

wherein $$V_{IN}^* = R_C i_P \frac{R_A+R_B}{R_B}. \quad (5)$$

The output signal of the frequency control circuit 11, which has been denoted as $S_F$ in FIGS. 5 and 6 is the current difference $i_{CH}-i_{FF}$, wherein the current $i_{CH}$ is provided by a further current source $Q_2$. In the depicted example, the current $i_{CH}$ determines the constant switching frequency $f_{PWM}$ and can be fixed at the time the switching converter is designed for a specific application. Accordingly, the switching frequency of the oscillator OSC is proportional to the current $i_{CH}-i_{FF}$, that is:

$$f_{PWM} \sim i_{CH}-i_{FF}. \quad (6)$$

Figure 9:
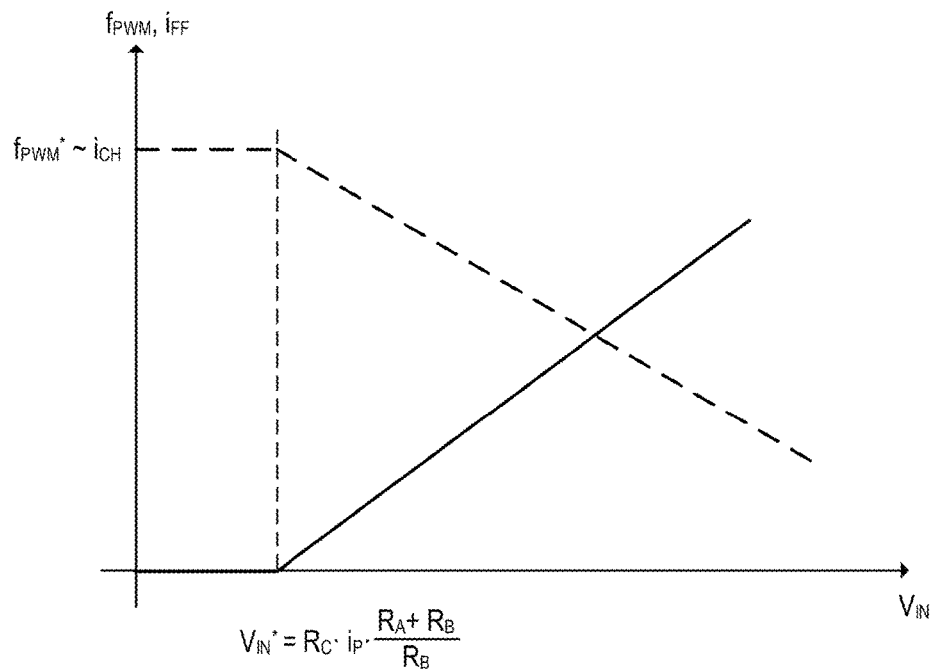
FIG. 9 is a diagram illustrating the function of the PWM frequency control circuit of FIG. 8.

FIG. 9 illustrates the function of the frequency control circuit 11 in combination with the oscillator OSC, which may be configured to generate a clock signal $S_{CLK}$ with a switching frequency $f_{PWM}$. For input voltages $V_{IN}$ lower than the threshold $V_{IN}^*$ the current $i_{FF}$ is zero and the frequency control circuit 11 generates a constant output current $i_{CH}$ (see equations (4) to (6)). For input voltages $V_{IN}$ greater than the threshold $V_{IN}^*$ the current $i_{FF}$ is linearly increases and the frequency control circuit 11 thus generates a linearly decreasing output current $i_{CH}-i_{FF}$ (see equations (4) to (6)). As the output current $i_{CH}-i_{FF}$ is used to control the oscillator OSC, the PWM switching frequency $f_{PWM}$ also linearly decreases with an increasing input voltage $V_{IN}$ (if $V_{IN}>V_{IN}^*$).

Although the exemplary implementation illustrated in FIGS. 8 and 9 provide a linear frequency decrease for high input voltages, other implementations may use a different characteristic such as the mentioned 1/x characteristic. Furthermore, it is understood that, although a specific analog implementation has been discussed as an example, other analog or (at least partly) digital implementations may be applicable. For example, in embodiments using an oscillator OSC that can be digitally controlled, by applying a digital signal at a control input, the input voltage $V_{IN}$ may be digitized and a respective digital frequency control signal (see, e.g., FIG. 5, signal $S_F$) may be digitally calculated, e.g. using a processor like a microcontroller or the like. The processor may be configured to execute software that implements a characteristic curve such as one of the curves shown in FIG. 7.

Figure 10:
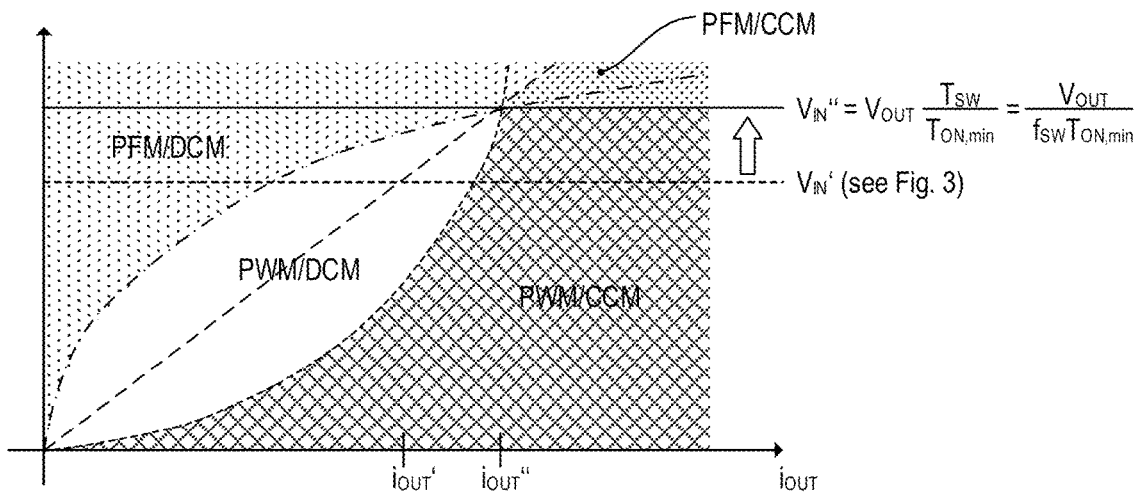
FIG. 10 is a diagram illustrating mode-switch conditions similar to FIG. 3, wherein the range of input voltages, which can be handled using PWM-CCM is increased as compared to the example of FIG. 3.

FIG. 10 is a diagram illustrating mode-switch conditions similar to FIG. 3. However, as compared to the example of FIG. 3, the range of input voltages, which can be handled using PWM-CCM, is increased as compared to the example of FIG. 3. Dependent on the actual implementation, operation in PFM-CCM can be avoided at all. As compared to the example of FIG. 3, the horizontal line defined by equation (1) or (2) is shifted upwards (towards higher input/output voltages) from $V_{IN}'$ to $V_{IN}'''$ (e.g. from 22 volts to 35 volts) by reducing the PWM switching frequency $F_{PWM}$ without performing a mode switch to PFMCCM. Dependent on the application the horizontal line at $V_{IN}'''$ is shifted upwards until it is equal to or higher than a maximum input voltage $V_{IN,MAX}$ of the switching converter. In this case, a mode-switch to PFM-CCM will never occur if the system is operated in accordance with the specification.

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

The invention claimed is:

1. A switching converter comprising:
   a switching circuit configured to receive a switching signal and to alternatingly connect an output node of the switching circuit with a supply node and a reference node in accordance with the switching signal, an input voltage being operably applied between the supply node and the reference node;
   an inductor coupled between the output node of the switching circuit and an output node of the switching converter;
   a frequency control circuit configured to:
     generate a first current;
     generate a second current by setting a magnitude of the second current to zero for magnitudes of the input voltage not greater than a predefined threshold value; and
     generate a frequency control signal based on a magnitude of the first current and the magnitude of the second current;
   an oscillator configured to:
     receive the frequency control signal; and
     generate a clock signal with an oscillator frequency in accordance with the frequency control signal such that the oscillator frequency decreases in response to an increase in a magnitude of the input voltage, if the magnitude of the input voltage is greater than the predefined threshold value; and
   a switching controller configured to receive the clock signal and to generate the switching signal using pulse-width modulation (PWM), wherein the frequency of the switching signal is set in accordance with the oscillator frequency and a duty cycle of the switching signal is determined using current-mode control.

2. The switching converter according to claim 1, wherein, for current-mode control, the duty cycle is set based on an inductor current passing through the inductor and further based on an output voltage at the output node of the switching converter.

3. The switching converter according to claim 1, further comprising:
a voltage sense circuit coupled to the output node of the switching converter and configured to provide a voltage sense signal representing the output voltage; and
a current sense circuit coupled to the inductor and configured to provide a current sense signal representing the inductor current,
wherein, for current-mode control, the duty cycle is set based on the current sense signal and the voltage sense signal.

4. The switching converter according to claim 1, wherein the frequency control circuit is configured to generate the frequency control signal such that the oscillator frequency remains substantially constant for magnitudes of the input voltage not greater than the predefined threshold value.

5. The switching converter according to claim 1, wherein the oscillator is configured to generate the clock signal such that, if the magnitude of the input voltage is greater than the predefined threshold value, the oscillator frequency decreases linearly or inversely proportional with the magnitude of the input voltage.

6. The switching converter according to claim 1,
wherein the switching controller is a multi-mode controller configured to operate in two or more operating modes, wherein the operating modes include two or more of: continuous conduction mode (CCM) using PWM, discontinuous conduction mode (DCM) using PWM, DCM using pulse frequency modulation (PFM), and
wherein a mode switch condition between two different operation modes depends on at least one of: the output voltage, the output current, or the input voltage.

7. The switching converter according to claim 1, wherein the switching circuit and the inductor are connected in a buck converter topology.

8. A method comprising:
alternatingly applying an input voltage and a reference potential to a first terminal of an inductor of a switching converter in accordance with a switching signal using a switching circuit included in the switching converter;
generating, using a frequency control circuit, a first current;
generating, using the frequency control circuit, a second current by setting a magnitude of the second current to zero for magnitudes of the input voltage not greater than a predefined threshold value;
generating, using the frequency control circuit, a frequency control signal based on a magnitude of the first current and the magnitude of the second current;
determining, using the frequency control circuit, that a magnitude of the input voltage is greater than the predefined threshold value;
generating a clock signal with an oscillator frequency depending on the input voltage using an oscillator such that the oscillator frequency decreases as the magnitude of the input voltage increases in response to determining that the magnitude of the input voltage is greater than the predefined threshold value; and
generating the switching signal using pulse-width modulation (PWM) using a switching controller, wherein the frequency of the switching signal is set in accordance with the oscillator frequency and a duty cycle of the switching signal is determined using current-mode control.

9. The method according to claim 8, wherein, for current-mode control, the duty cycle is set based on an inductor current passing through the inductor and further based on an output voltage at an output node of the switching converter.

10. The method according to claim 8, further comprising:
sensing an output voltage a voltage at an output node of the switching converter and providing a respective voltage sense signal; and
sensing an inductor current passing through the inductor ($L_O$) and providing a respective current sense signal,
wherein, for current-mode control, the duty cycle is set based on the current sense signal and the voltage sense signal.

11. The method according to claim 8, wherein generating the frequency control signal having the magnitude of zero comprises generating the frequency control signal such that the oscillator frequency remains substantially constant for magnitudes of the input voltage not greater than the predefined threshold value.

12. The method according to claim 8, wherein, for magnitudes of the input voltage is greater than the predefined threshold value, the oscillator frequency decreases linearly or in inversely proportional with the magnitude of the input voltage.

13. The method according to claim 8, further comprising:
detecting a mode-switch condition while operating in PWM continuous conduction mode; and
changing the operating mode of the switching controller upon detection of a mode switch condition.

14. The switching converter according to claim 1, wherein, if the magnitude of the input voltage is greater than the predefined threshold value, the oscillator frequency is inversely proportional with the magnitude of the input voltage.

15. The method according to claim 8, wherein generating the clock signal comprises generating the clock signal such that a frequency of the clock signal is inversely proportional with the magnitude of the input voltage in response to determining that the magnitude of the input voltage is greater than the predefined threshold value.

16. A switching converter comprising:
a switching circuit configured to receive a switching signal and to alternatingly connect an output node of the switching circuit with a supply node and a reference node in accordance with the switching signal, an input voltage being operably applied between the supply node and the reference node;
an inductor coupled between the output node of the switching circuit and an output node of the switching converter;
a frequency control circuit configured to:
receive the input voltage;
generate a first current;
generate a second current by setting a magnitude of the second current to zero for magnitudes of the input voltage not greater than a predefined threshold value; and generate a frequency control signal based on a magnitude of the first current and the magnitude of the second current;

an oscillator configured to:
receive the frequency control signal that depends on a magnitude of the input voltage; and
generate a clock signal with an oscillator frequency set in accordance with the frequency control signal such that:
the oscillator frequency remains constant when the magnitude of the input voltage not greater than a predefined threshold value; and
the oscillator frequency is inversely proportional with the magnitude the input voltage when the magnitude of the input voltage is greater than the predefined threshold value; and a switching controller configured to receive the clock signal and to generate the switching signal using pulse-width modulation (PWM), wherein the frequency of the switching signal is set in accordance with the oscillator frequency and a duty cycle of the switching signal is determined using current-mode control.

* * * * *